United States Patent
Bombelli et al.

(10) Patent No.: US 11,019,720 B2
(45) Date of Patent: May 25, 2021

(54) METHOD FOR TRANSFORMING THE IMPEDANCE OF A RADIO-FREQUENCY TRANSMISSION LINE OF A PRINTED CIRCUIT AND PRINTED CIRCUIT THEREOF

(71) Applicant: GatesAir, Inc., Mason, OH (US)

(72) Inventors: Carlo Bombelli, Roncadelle (IT); Silvio Coradi, Brescia (IT)

(73) Assignee: GatesAir, Inc., Mason, OH (US)

( * ) Notice: Subject to any disclaimer, the term of this patent is extended or adjusted under 35 U.S.C. 154(b) by 0 days.

(21) Appl. No.: 16/669,076

(22) Filed: Oct. 30, 2019

(65) Prior Publication Data

US 2020/0137872 A1 Apr. 30, 2020

(30) Foreign Application Priority Data

Oct. 31, 2018 (IT) .......................... 102018000009997

(51) Int. Cl.
*H03F 1/07* (2006.01)
*H05K 1/02* (2006.01)
*H03F 1/02* (2006.01)

(52) U.S. Cl.
CPC ........... *H05K 1/025* (2013.01); *H03F 1/0288* (2013.01); *H03F 2200/204* (2013.01); *H03F 2200/423* (2013.01); *H03F 2200/451* (2013.01)

(58) Field of Classification Search
CPC .................................. H03F 1/07; H03F 1/0288

(Continued)

(56) References Cited

U.S. PATENT DOCUMENTS 9,252,722 B2 * 2/2016 Pham ..................... H03F 1/0288
2011/0204993 A1 8/2011 Masuda (Continued)

OTHER PUBLICATIONS

Italian Search Report and Written Opinion dated Jun. 26, 2019, issued in Italian Application No. 201800009997, filed Oct. 31, 2019.

(Continued)

*Primary Examiner* — Henry Choe
(74) *Attorney, Agent, or Firm* — Calfee, Halter & Griswold LLP

(57) ABSTRACT

A method for transforming the impedance of a radio-frequency transmission line of a printed circuit from a first impedance value to a second impedance value, the radio-frequency transmission line being adapted to transport a radio-frequency signal at a frequency value comprised in a frequency range defined between a minimum frequency value and a maximum frequency value, wherein the following steps are envisaged:—dividing the radio-frequency transmission line into a plurality of circuit sections each one of the circuit sections including a first and a second impedance connected in parallel with each other by two circuit branches placed at a maximum distance ($d_{max}$) from each other, wherein the circuit sections have respective third impedance values that gradually increase, respectively decrease, from the first impedance value to the second impedance value;—determining the maximum distance between the circuit branches in such a way as to avoid any undesired frequency values within the frequency range;—setting a fourth impedance value of one of the two impedances;—calculating a fifth impedance value of the other one of the two impedances, such that the impedance value of the circuit section is the third respective impedance value.

9 Claims, 2 Drawing Sheets

(58) Field of Classification Search
USPC .............................................. 330/124 R, 295
See application file for complete search history.

(56) References Cited

U.S. PATENT DOCUMENTS

| | | |
|---|---|---|
| 2014/0118071 A1 | 5/2014 | Mei et al. |
| 2016/0064791 A1* | 3/2016 | Ono .................. H01P 5/028 |
| | | 333/35 |
| 2016/0197584 A1 | 7/2016 | Tanimoto |
| 2018/0026588 A1 | 1/2018 | Nagasaku |
| 2018/0183388 A1* | 6/2018 | Pham ................. H03F 1/0288 |

OTHER PUBLICATIONS

Kian Sen Ang et al., *Multisection Impedance-Transforming Coupled-Line Baluns*, IEEE on Transactions Microwave Theory and Techniques, vol. 51, No. 2, Feb. 2003, pp. 536-541.

* cited by examiner

METHOD FOR TRANSFORMING THE IMPEDANCE OF A RADIO-FREQUENCY TRANSMISSION LINE OF A PRINTED CIRCUIT AND PRINTED CIRCUIT THEREOF

BACKGROUND OF THE INVENTION

1. The Field of the Invention

The present invention relates to a method for transforming the impedance of a radio-frequency transmission line of a printed circuit and to a printed circuit that comprises said radio-frequency transmission line. In particular, said radio-frequency transmission line belongs to a Doherty amplifier.

2. The Relevant Technology

In order to avoid introducing any signal alteration, signal amplifiers, particularly those amplifying width-modulated signals, must show high linearity throughout the effective passband of the signal involved.

Signals requiring especially high linearity include all signal types with digital modulation used by all standards currently known for radio and television broadcasting.

Before the introduction of the Doherty configuration, the signal amplifier modules that were commercially available, or anyway physically feasible, were characterized by a decidedly unsatisfactory efficiency, much lower than 30% and very often below 20%.

This poor efficiency also implies, in addition to a particularly high energy consumption (relative to the gain produced by the module), the need for removing from the amplification module, and then dissipating, a considerable amount of heat, leading to the use of an oversized cooling/conditioning system and to additional costs incurred for the energy required for the operation of such a system.

For example, with an efficiency of 20%, an amplifier producing 10,000 W of output power absorbs 50,000 W of power from the electric network, and requires the installation and operation of a cooling system capable of removing and dissipating 40,000 W.

In conditioning systems, it can be presumed that the electric consumption further increases by approx. 20,000 W. Therefore, the system equipment necessary for obtaining 10,000 W of effective output power implies a power consumption of 70,000 W, with a "real" efficiency (evaluated over the entire system equipment required) of approx. 14%.

The Doherty configuration permits a considerable increase in the efficiency of amplification systems: in particularly accurate implementations, it may reach values in excess of 45%.

In the above example, a Doherty amplifier with an efficiency of 45% and 10,000 W of output power absorbs from the electric network approx. 22,000 W of power, and requires the installation and operation of a cooling system capable of removing and dissipating approx. 12,000 W.

In conditioning systems, it can be presumed that the electric consumption further increases by approx. 6,000 W. Therefore, the system equipment necessary for obtaining 10,000 W of effective output power implies a power consumption of 28,000 W, with a "real" efficiency (evaluated over the entire system equipment required) of approx. 36%.

The advantage is apparent. However, due to the physical principles it is based upon, the making of a Doherty circuit requires the use of additional physical space compared to standard configurations.

Commercial amplification systems must nevertheless meet specific dimensional constraints. Let us consider, by way of example, an amplification system intended for use in a radio or television signal broadcasting chain. For purposes of space optimization and wiring harness rationalization in communications rooms, the market has universally adopted the solution of installing frames or racks in communication rooms, wherein the dimensions and distances between the racks are standardized.

Within such racks, which are commonly available from many manufacturers, the different elements that make up the entire system equipment of broadcasting stations, including the amplification systems, have to be inserted or installed. Such racks, typically having a vertical development, are standardized in accordance with the EIA-310 rack specification.

A rack unit, abbreviated as U (or, less frequently, as RU or HU, Height Unit), is a unit of measure used to indicate the height of the components installed in a 19-inch or 23-inch rack. A rack unit corresponds to 1.75 inches or 44.45 mm.

In manufacturers' specifications, an apparatus that is one rack unit tall is often indicated as "1U"; taller apparatuses are indicated as "2U", "4U", and so forth. This makes it possible to easily calculate the necessary space occupation.

It follows that, in order to make its own products marketable, a manufacturer of amplification systems cannot freely establish the footprint and height dimensions thereof, but has to comply with the above-mentioned exact dimensional constraints.

A manufacturer wanting to make a Doherty amplification system, which, as aforementioned, requires more room than a traditional configuration, must therefore choose whether to reduce the power output without increasing the space occupation or to keep the power output unchanged at the cost of increased space occupation. Since the footprint of the apparatuses is fixed (equal to the footprint of racks compliant with the EIA-310 standard), the manufacturer can only increase the vertical space occupation by occupying more rack units.

This results in a smaller number of apparatuses that can be installed in a single rack, giving rise to several criticalities in the communications rooms of broadcasting sites, which may ultimately even lead to such rooms having to be enlarged. In some cases, however, an enlargement may not be feasible because the communications rooms are located underground or on towers, etc.

FIG. 1 shows a block diagram of a Doherty amplifier 30 according to the prior art. An input signal 2, generated by a signal source 1, is divided into two separate output signals 4,5, phase-shifted by 90° by means of a hybrid coupler 3 or a suitable divider network.

The two output signals 4,5 are then applied to the input of two different respective amplifiers 6,8, which, being differently biased (typically one as Class AB for the carrier and at least one as Class C for the peak), must then be recombined to recover the phase difference applied to the input.

To do so, an additional line 7 of electric length equal to ¼ of the wave of the frequency of the input signal 2 is normally used, which also ensures, in addition to the correct phase, the insulation between the two amplifiers 6,8 by acting as an impedance inverter.

A need therefore arises for transforming the impedance (which is typically low, e.g., 2Ω) from a recombination node 9, which is located downstream of the carrier amplifier 6 and the peak amplifier 8, to a delivery node 11 towards a load 12 (typically at 50Ω) that is located downstream of the recombination node 9.

FIG. 2 illustrates a radio-frequency transmission line 25 according to the prior art.

According to the prior art, the impedance transformation from a first node V1 to a second node $V_2$ (in the above case from 2Ω to 50Ω) is effected by identifying a plurality of circuit sections $S_1,S_2,S_3$ and sizing the total impedance $P_1,P_3,P_5$ of each circuit section $S_1,S_2,S_3$ in such a way that it gradually increases from the first impedance value $V_1$ to the second impedance value $V_2$.

For example, if the first impedance value $V_1$ is 2Ω and the second impedance value $V_2$ is 50Ω, then the impedance values $P_1,P_3,P_5$ of the respective circuit sections $S_1,S_2,S_3$ may be 10, 20 and 30Ω, respectively.

The impedance transformation is preferably obtained by using transmission lines having appropriate shapes and dimensions applied to an insulating substrate of a printed circuit. Such impedance transformation may likewise be applied to stripline, coaxial, etc. transmission lines.

However, the implementation of the impedance transformation according to the prior art results either in increased space occupation on the printed circuit or, if one wants to keep the physical space unchanged, in reduced output power. Given the fact that any transform will reduce the output power because of a real loss, a transform that occupies more space, all other characteristics being equal, will typically have a smaller loss.

SUMMARY OF THE INVENTION

It is therefore one object of the present invention to provide a method for transforming the impedance of a radio-frequency transmission line which allows reducing the footprint necessary for implementing it on a printed circuit.

It is a further object of the present invention to provide a method for transforming the impedance of a radio-frequency transmission line which allows reducing the losses when implemented on a printed circuit.

These and other objects of the present invention are achieved through a method for transforming the impedance of a radio-frequency transmission line of a printed circuit and a printed circuit that comprises said radio-frequency transmission line, as well as a Doherty amplifier that comprises said radio-frequency transmission line, as claimed in the appended claims, which are an integral part of the present invention.

In brief, the method of the present invention envisages to obtain the characteristic impedance of a circuit section of a printed circuit by using two transmission lines mutually connected by two circuit branches, wherein the two transmission lines have an approximately doubled impedance, so that they can be implemented by means of printed circuit tracks having an approximately halved footprint width. The two circuit branches are arranged at a maximum distance to avoid any undesired frequencies in which circuit disturbances are generated.

Further advantageous features of the present invention are set out in the appended claims.

BRIEF DESCRIPTION OF THE DRAWINGS

Such features as well as further advantages of the present invention will become more apparent from the following description of an embodiment thereof as shown in the annexed drawings, which are supplied by way of non-limiting example, wherein.

DETAILED DESCRIPTION OF THE PREFERRED EMBODIMENTS

Figure 3:
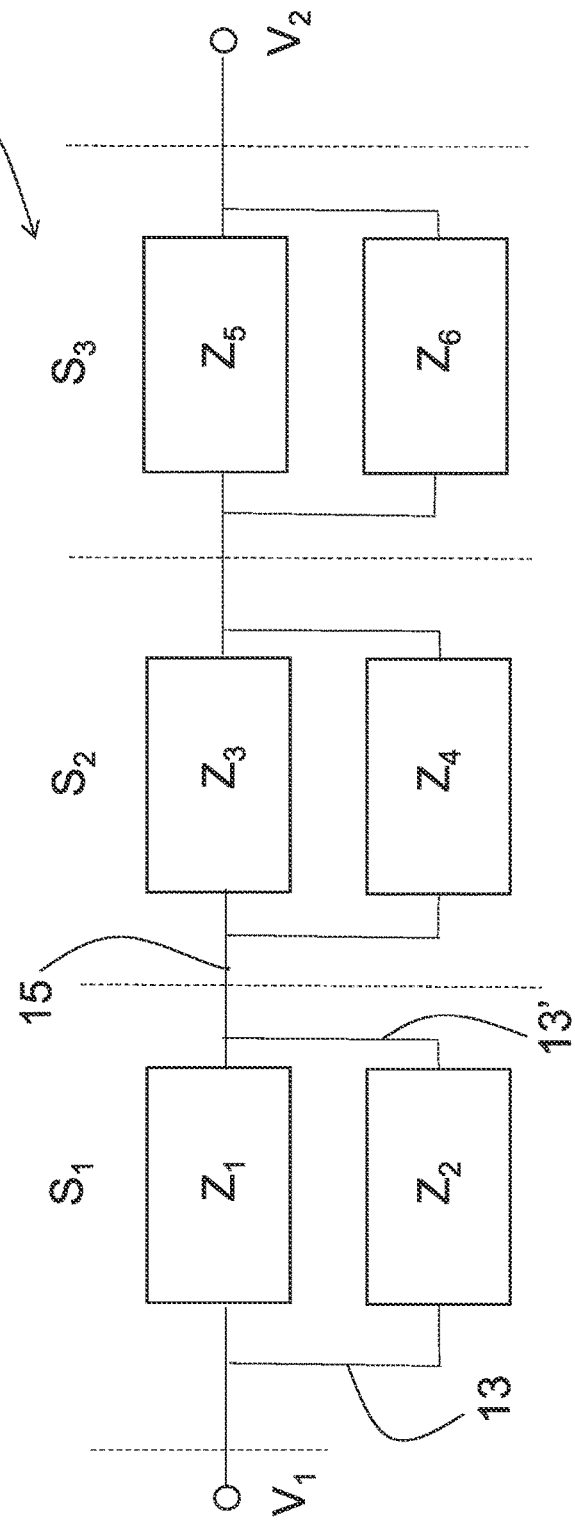
FIG. 3 shows a radio-frequency transmission line of a printed circuit according to the invention.

With reference to FIG. 3, there is shown a radio-frequency transmission line 20 comprising a plurality of, e.g., three, circuit sections $S_1,S_2,S_3$.

Each circuit section $S_1,S_2,S_3$ corresponds to a transmission line tract having a footprint width that is inversely proportional to the impedance. Therefore, as the impedance grows, the width of the transmission line tract decreases.

With reference, for simplicity's sake, only to the circuit section $S_1$, this can be schematized as a first impedance $Z_1$ placed in parallel with a second impedance Z2 and mutually connected by two circuit branches 13,13' placed at a maximum distance $d_{max}$ from each other.

The circuit sections $S_2,S_3$ show a similar circuit arrangement.

Typically, the circuit sections $S_1,S_2,S_3$ have each a length λ/4, where λ is the wavelength of the signal going through the radio-frequency transmission line 20. However, other length values should not be excluded.

The radio-frequency transmission line 20 is adapted to transport a radio-frequency signal at a frequency value comprised within a frequency range defined between a minimum frequency value $f_{min}$ and a maximum frequency value $f_{max}$.

In a first step of the method according to the invention, in order to transform the impedance of the radio-frequency transmission line 20 from a first impedance value $V_1$ to a second impedance value $V_2$, the circuit designer sizes the total impedance of each circuit section $S_1,S_2,S_3$ in accordance with the prior art, such that it gradually increases, respectively decreases, from the first impedance value $V_1$ to the second impedance value $V_2$.

As aforementioned, if the first impedance value $V_1$ is 2Ω and the second impedance value $V_2$ is 50Ω, then the impedance values of the circuit sections $S_1,S_2,S_3$ may be, for example, 10, 20 and 30Ω, respectively.

In a second step, it is necessary to calculate a maximum distance $d_{max}$ at which the two circuit branches 13,13' must be placed. In fact, this being a radio-frequency circuit, disturbances (notches) might arise at certain undesired frequency values, which should therefore be avoided.

The Applicant has experimentally verified that such certain frequencies can be obtained with the formula $f_k=(f_{TL1} \cdot \lambda / 2 \cdot k)/EL_{TL1}$, where $f_{TL1}$ is the intermediate frequency (band center frequency) between said minimum frequency $f_{min}$ and said maximum frequency $f_{max}$, λ is the wavelength of a signal going through said radio-frequency transmission line 20, k is an integer number belonging to the set of natural numbers, greater than or equal to one, and $EL_{TL1}$ is the electric length of the transmission line tract between the two circuit branches 13,13', expressed in multiples of λ at the frequency $f_{TL1}$.

To make sure that such disturbances will fall outside said frequency range, it is therefore sufficient to impose that at no frequency within the frequency range the maximum distance $d_{max}$ between the two circuit branches 13,13' is equal to λ/2 or an integer multiple thereof.

In a third step, the designer sets the value of the first impedance $Z_1$ and determines the value of the second impedance $Z_2$ such that the impedance value of the circuit section $S_1$ is the one fixed beforehand.

Figure 1:
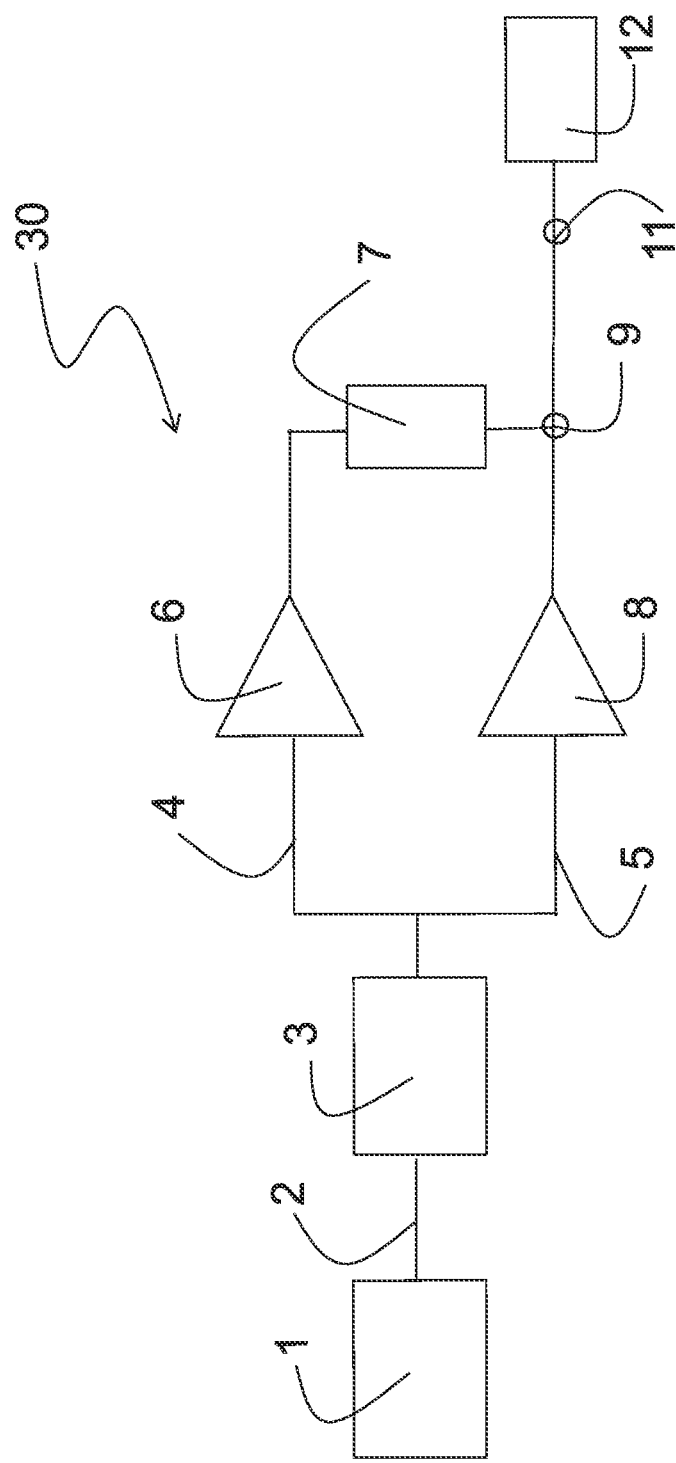
FIG. 1 shows a block diagram of a Doherty amplifier according to the prior art.

When implementing the transmission line 20 on a printed circuit, it can be observed that, advantageously, the impedance $Z_1$ is twice the impedance $P_1$ of the prior-art circuit of FIG. 1, and also that the impedance $Z_2$ is approximately equal to $Z_1$ (approximately equal because $Z_1$ must be determined in such a way as to compensate for the effect of the two vertical branches 13,13'). It is thus possible to create two transmission line tracts having a footprint width equal to approximately half the width required by the corresponding transmission line tract of the circuit of FIG. 2. This is because track width is inversely proportional to impedance, and hence the footprint width decreases as the impedance increases.

Figure 2:
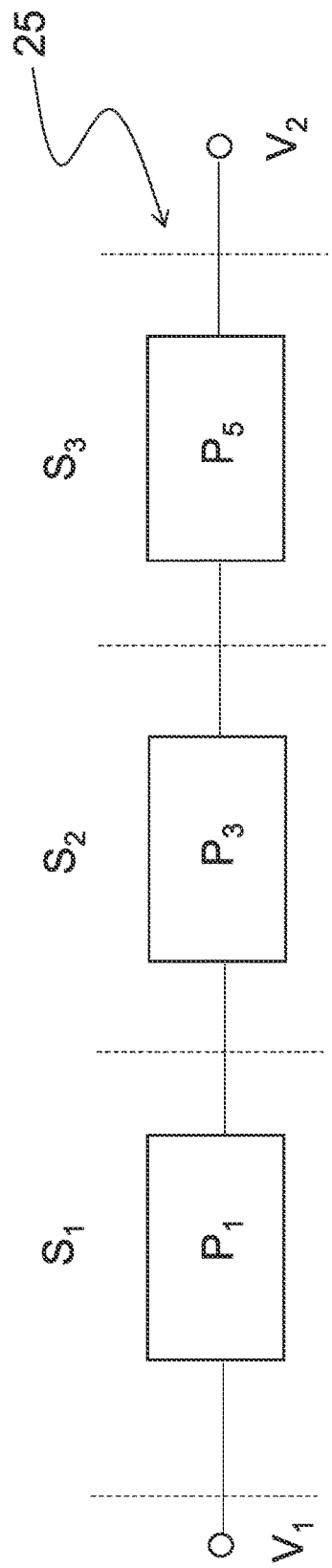
FIG. 2 shows a radio-frequency transmission line of a printed circuit according to the prior art.

Advantageously, by implementing the tracks that constitute each one of the two transmission line tracts with impedance $Z_1$ and $Z_2$ in distinct planes, e.g., on the opposite sides of a suitable printed circuit board, it is possible to reduce by half the necessary footprint area in comparison with the prior-art circuit of FIG. 2.

It should be observed that the embodiment of FIG. 3 also solves possible multiple-path problems that are typical of radio-frequency circuits. In fact, the connection between each circuit section $S_1, S_2, S_3$ consists of a single line tract 15.

The radio-frequency transmission line 20 illustrated in FIG. 3 may advantageously constitute the transmission line that connects the recombination node 9 to the delivery node 11 of a Doherty amplifier, as shown in FIG. 1.

Therefore, the present invention advantageously makes it possible to obtain narrower circuit lines that take less space or, as an alternative, to reduce the losses of an amplifier in Doherty configuration while leaving its dimensions unchanged.

This latter advantage can be further clarified by means of a numerical example.

Let us assume that a first track having an impedance of 50Ω is available. As previously explained, when the footprint width of the track is doubled, the impedance is halved to a value of 25Ω. By acting upon the material of the support of the printed circuit, it is possible to bring the impedance back to 50Ω. By dividing the first track into two second tracks (e.g., like those represented by the impedances $Z_1$ and $Z_2$ of the circuit section $S_1$ of FIG. 3), a total impedance of 100Ω is obtained. If the two second tracks thus obtained are arranged in a symmetrical and parallel manner, the impedance will return to the original value of 50Ω (of the first track), but the current flowing through each one of the two second tracks will now be halved. Since the losses follow a law that depends on the square of the current, it is apparent that, when the currents are halved, the losses will also be reduced accordingly.

The method for transforming the impedance of a radio-frequency transmission line of a printed circuit and the printed circuit thereof described herein by way of example may be subject to many possible variations without departing from the novelty spirit of the inventive idea; it is also clear that in the practical implementation of the invention the illustrated details may have different shapes or be replaced with other technically equivalent elements.

It can therefore be easily understood that the present invention is not limited to a method for transforming the impedance of a radio-frequency transmission line of a printed circuit and a printed circuit thereof described herein by way of example, but may be subject to many modifications, improvements or replacements of equivalent parts and elements without departing from the inventive idea, as clearly specified in the following claims.

What is claimed is:

1. A method for transforming the impedance of a radio-frequency transmission line of a printed circuit from a first impedance value to a second impedance value, said radio-frequency transmission line being adapted to transport a radio-frequency signal at a frequency value comprised in a frequency range defined between a minimum frequency value and a maximum frequency value, said method being characterized in that it comprises the steps of:

dividing said radio-frequency transmission line into a plurality of circuit sections, each one of said circuit sections comprising a first and a second impedance connected in parallel with each other by two circuit branches placed at a maximum distance ($d_{max}$) from each other, wherein said circuit sections have respective third impedance values that gradually increase, respectively decrease, from said first impedance value to said second impedance value;

determining said maximum distance ($d_{max}$) between said circuit branches in such a way as to avoid any undesired frequency values within said frequency range;

setting a fourth impedance value of one of said two impedances;

calculating a fifth impedance value of the other one of said two impedances, such that the impedance value of said circuit section is said third respective impedance value.

2. The method according to claim 1, wherein said maximum distance ($d_{max}$) is calculated in such a way that at no frequency within said frequency range it is equal to $\lambda/2$ or an integer multiple thereof, wherein $\lambda$ is the wavelength of a signal going through said radio-frequency circuit line.

3. The method according to claim 1, wherein said first and said second impedances are implemented through respective tracks of said printed circuit, arranged in distinct planes.

4. The method according to claim 3, wherein said respective tracks are made on opposite sides of said printed circuit.

5. The method according to claim 2, wherein said circuit sections have a length equal to $\lambda/4$.

6. A printed circuit comprising a radio-frequency transmission line having a first node at a first impedance value and a second node at a second impedance value, said radio-frequency transmission line being adapted to transport a radio-frequency signal at a frequency value comprised in a frequency range defined between a minimum frequency value and a maximum frequency value, wherein:

said radio-frequency transmission line is divided into a plurality of circuit sections, each one of said circuit sections comprising a first and a second impedance connected in parallel with each other by two circuit branches placed at a maximum distance ($d_{max}$) from each other, wherein said circuit sections have respective third impedance values that gradually increase, respectively decrease, from said first impedance value to said second impedance value;

a maximum distance ($d_{max}$) between said circuit branches is set in such a way as to avoid any undesired frequency values within said frequency range;

one of said two impedances has a predetermined fourth impedance value;

the other one of said two impedances has a fifth impedance value, such that the impedance value of said circuit section is said third respective impedance value.

7. The printed circuit according to claim 6, wherein said maximum distance ($d_{max}$) is calculated in such a way that at no frequency within said frequency range it is equal to $\lambda/2$ or an integer multiple thereof, wherein $\lambda$ is the wavelength of a signal going through said radio-frequency circuit line.

8. A Doherty amplifier comprising:
- a signal source adapted to generate an input signal;
- a hybrid coupler adapted to receive said input signal and divide it into first and second output signals phase-shifted by 90°;
- a carrier amplifier adapted to receive as input said first output signal;
- a peak amplifier adapted to receive as input said second output signal;
- a line having an electric length equal to ¼ of a wave of the frequency of said input signal, arranged downstream of said carrier amplifier;
- a recombination node adapted to receive the output signals from said line and from said peak amplifier, said recombination node being connected to a delivery node towards a load by a transmission line, wherein said transmission line is adapted to transport a radio-frequency signal at a frequency value comprised in a frequency range defined between a minimum frequency value and a maximum frequency value, wherein:
- said radio-frequency transmission line is divided into a plurality of circuit sections, each one of said circuit sections comprising a first and a second impedance connected in parallel with each other by two circuit branches placed at a maximum distance ($d_{max}$) from each other, wherein said circuit sections have respective third impedance values that gradually increase, respectively decrease, from said first impedance value to said second impedance value;
- a maximum distance between said circuit branches is set in such a way as to avoid any undesired frequency values within said frequency range;
- one of said two impedances has a predetermined fourth impedance value;
- the other one of said two impedances has a fifth impedance value, such that the impedance value of said circuit section is said third respective impedance value.

9. The Doherty amplifier according to claim 8, wherein said maximum distance ($d_{max}$) is calculated in such a way that at no frequency within said frequency range it is equal to $\lambda/2$ or an integer multiple thereof, wherein $\lambda$ is the wavelength of a signal going through said radio-frequency circuit line.

* * * * *